United States Patent
Li et al.

(10) Patent No.: US 11,139,315 B2
(45) Date of Patent: Oct. 5, 2021

(54) FERROELECTRIC TRANSISTOR

(71) Applicant: QUALCOMM Incorporated, San Diego, CA (US)

(72) Inventors: Xia Li, San Diego, CA (US); Haining Yang, San Diego, CA (US); Bin Yang, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 13 days.

(21) Appl. No.: 16/669,837

(22) Filed: Oct. 31, 2019

(65) Prior Publication Data
US 2021/0134812 A1 May 6, 2021

(51) Int. Cl.
| | |
|---|---|
| *H01L 27/11* | (2006.01) |
| *H01L 29/51* | (2006.01) |
| *H01L 29/78* | (2006.01) |
| *H01L 27/1159* | (2017.01) |
| *H01L 29/66* | (2006.01) |
| *H01L 21/28* | (2006.01) |

(52) U.S. Cl.
CPC .... *H01L 27/1159* (2013.01); *H01L 29/40111* (2019.08); *H01L 29/516* (2013.01); *H01L 29/517* (2013.01); *H01L 29/6684* (2013.01); *H01L 29/66795* (2013.01); *H01L 29/7851* (2013.01); *H01L 29/78391* (2014.09)

(58) Field of Classification Search
CPC .......... H01L 27/1159; H01L 29/78391; H01L 29/516; H01L 29/6684; H01L 29/517; H01L 29/66795; H01L 29/40111; H01L 29/7851

USPC ......................................................... 257/295
See application file for complete search history.

(56) References Cited

U.S. PATENT DOCUMENTS

| | | | | |
|---|---|---|---|---|
| 9,159,829 | B1 * | 10/2015 | Ramaswamy | ........ H01L 29/516 |
| 9,853,150 | B1 * | 12/2017 | Colinge | ............ H01L 29/40111 |
| 2007/0176218 | A1 * | 8/2007 | Kang | ................. H01L 27/11502 |
| | | | | 257/295 |
| 2012/0175696 | A1 * | 7/2012 | Franzon | ............... H01L 29/7881 |
| | | | | 257/316 |
| 2017/0162250 | A1 * | 6/2017 | Slesazeck | ............. H01L 29/517 |
| 2017/0162587 | A1 * | 6/2017 | Chavan | ............. H01L 21/28088 |
| 2017/0178712 | A1 * | 6/2017 | Van Houdt | ........... G11C 11/223 |
| 2017/0207225 | A1 * | 7/2017 | Mueller | ............ H01L 27/10894 |
| 2017/0309488 | A1 * | 10/2017 | Sakai | ................ H01L 21/02181 |
| 2018/0053832 | A1 * | 2/2018 | Beyer | ............... H01L 29/78391 |
| 2018/0151745 | A1 * | 5/2018 | Chang | ................. H01L 29/4958 |

(Continued)

*Primary Examiner* — Sheikh Maruf
(74) *Attorney, Agent, or Firm* — Patterson & Sheridan, L.L.P.

(57) ABSTRACT

Certain aspects of the present disclosure are directed to a semiconductor device. The semiconductor device generally includes a ferroelectric (FE) semiconductor device having a channel region; a gate oxide; a FE region, wherein the gate oxide is disposed between the FE region and the channel region; a gate region, wherein the FE region is disposed between the gate oxide and the gate region; a first semiconductor region disposed adjacent to the channel region; and a second semiconductor region disposed adjacent to the channel region. The semiconductor device may also include a transistor, wherein a region of the transistor is connected to the gate region, the first semiconductor region, or the second semiconductor region of the FE semiconductor device.

14 Claims, 11 Drawing Sheets

(56) References Cited

U.S. PATENT DOCUMENTS

| | | | |
|---|---|---|---|
| 2018/0190338 A1* | 7/2018 | Li | G11C 11/22 |
| 2018/0240803 A1* | 8/2018 | Yoo | H01L 29/40111 |
| 2018/0240804 A1* | 8/2018 | Yoo | H01L 29/516 |
| 2019/0131382 A1* | 5/2019 | Lu | H01L 29/785 |
| 2019/0198617 A1* | 6/2019 | Li | H01L 29/1045 |
| 2019/0237470 A1* | 8/2019 | Mine | H01L 27/11597 |
| 2020/0006359 A1* | 1/2020 | Wu | H01L 27/1159 |
| 2020/0075609 A1* | 3/2020 | Morris | G11C 11/2273 |
| 2020/0176610 A1* | 6/2020 | Lee | H01L 29/786 |
| 2020/0194591 A1* | 6/2020 | Kim | H01L 21/823437 |
| 2020/0243687 A1* | 7/2020 | Ota | B82Y 10/00 |

* cited by examiner

FERROELECTRIC TRANSISTOR

FIELD OF THE DISCLOSURE

The teachings of the present disclosure relate generally to electronic systems, and more particularly, to a device implemented with a ferroelectric semiconductor device.

BACKGROUND

Electronic devices including processors and memory are used extensively today in almost every electronic application. The processor controls the execution of program instructions, arithmetic functions, and access to memory and peripherals. In the simplest form, the processor executes program instructions by performing one or more arithmetic functions on data stored in memory. There are many different types of memory, which may be implemented using any of various suitable technologies.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Certain aspects of the present disclosure are directed to a semiconductor device. The semiconductor device generally includes a ferroelectric (FE) semiconductor device having a channel region; a gate oxide; a FE region, wherein the gate oxide is disposed between the FE region and the channel region; a gate region, wherein the FE region is disposed between the gate oxide and the gate region; a first semiconductor region disposed adjacent to the channel region; and a second semiconductor region disposed adjacent to the channel region. The semiconductor device may also include a transistor, wherein a region of the transistor is connected to the gate region, the first semiconductor region, or the second semiconductor region of the FE semiconductor device.

Certain aspects of the present disclosure are directed to a method for fabricating a semiconductor device, in accordance with certain aspects of the present disclosure. The method generally includes forming a FE semiconductor device by forming a channel region, forming a gate oxide, forming a FE region such that the gate oxide is between the FE region and the channel region, forming a gate region such that the FE region is between the gate oxide and the gate region, forming a first semiconductor region adjacent to the channel region, and forming a second semiconductor region adjacent to the channel region. The method may also include forming a transistor, wherein a region of the transistor is connected to the gate region, the first semiconductor region, or the second semiconductor region of the FE semiconductor device.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Figure 1:
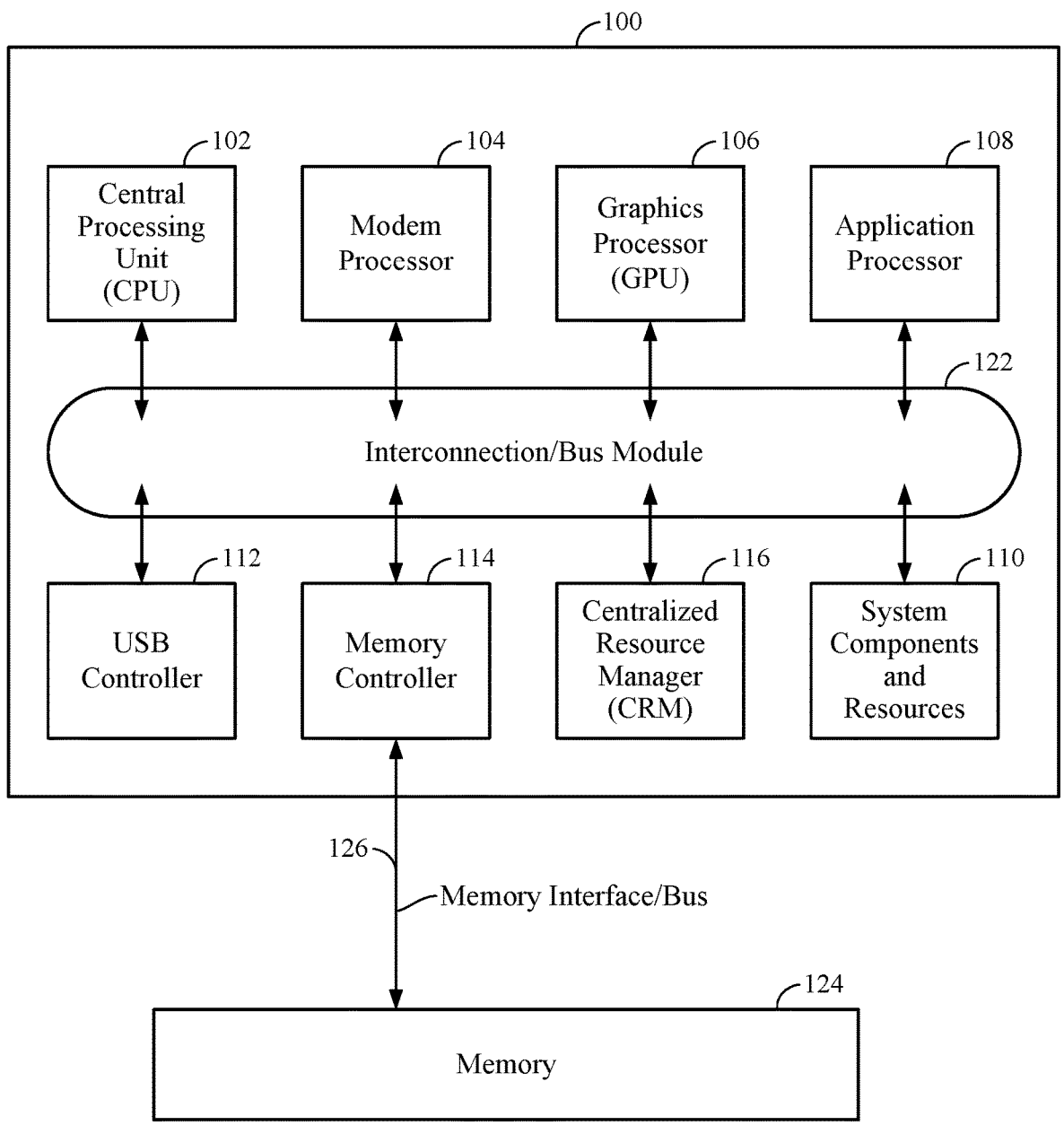
FIG. 1 is an illustration of an exemplary system-on-chip (SoC) integrated circuit design, in accordance with certain aspects of the present disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

The various aspects will be described in detail with reference to the accompanying drawings. Wherever possible, the same reference numbers will be used throughout the drawings to refer to the same or like parts. References made to particular examples and implementations are for illustrative purposes, and are not intended to limit the scope of the disclosure or the claims.

The terms "computing device" and "mobile device" are used interchangeably herein to refer to any one or all of servers, personal computers, smartphones, cellular telephones, tablet computers, laptop computers, netbooks, ultra-books, palm-top computers, personal data assistants (PDAs), wireless electronic mail receivers, multimedia Internet-enabled cellular telephones, Global Positioning System (GPS)

receivers, wireless gaming controllers, and similar personal electronic devices which include a programmable processor. While the various aspects are particularly useful in mobile devices (e.g., smartphones, laptop computers, etc.), which have limited resources (e.g., processing power, battery, size, etc.), the aspects are generally useful in any computing device that may benefit from improved processor performance and reduced energy consumption.

The term "multicore processor" is used herein to refer to a single integrated circuit (IC) chip or chip package that contains two or more independent processing units or cores (e.g., CPU cores, etc.) configured to read and execute program instructions. The term "multiprocessor" is used herein to refer to a system or device that includes two or more processing units configured to read and execute program instructions.

The term "system on chip" (SoC) is used herein to refer to a single integrated circuit (IC) chip that contains multiple resources and/or processors integrated on a single substrate. A single SoC may contain circuitry for digital, analog, mixed-signal, and radio-frequency functions. A single SoC may also include any number of general purpose and/or specialized processors (digital signal processors (DSPs), modem processors, video processors, etc.), memory blocks (e.g., ROM, RAM, flash, etc.), and resources (e.g., timers, voltage regulators, oscillators, etc.), any or all of which may be included in one or more cores.

Memory technologies described herein may be suitable for storing instructions, programs, control signals, and/or data for use in or by a computer or other digital electronic device. Any references to terminology and/or technical details related to an individual type of memory, interface, standard, or memory technology are for illustrative purposes only, and not intended to limit the scope of the claims to a particular memory system or technology unless specifically recited in the claim language. Mobile computing device architectures have grown in complexity, and now commonly include multiple processor cores, SoCs, co-processors, functional modules including dedicated processors (e.g., communication modem chips, GPS receivers, etc.), complex memory systems, intricate electrical interconnections (e.g., buses and/or fabrics), and numerous other resources that execute complex and power intensive software applications (e.g., video streaming applications, etc.).

FIG. 1 illustrates example components and interconnections in a system-on-chip (SoC) 100 suitable for implementing various aspects of the present disclosure. The SoC 100 may include a number of heterogeneous processors, such as a central processing unit (CPU) 102, a modem processor 104, a graphics processor 106, and an application processor 108. Each processor 102, 104, 106, 108, may include one or more cores, and each processor/core may perform operations independent of the other processors/cores. The processors 102, 104, 106, 108 may be organized in close proximity to one another (e.g., on a single substrate, die, integrated chip, etc.) so that the processors may operate at a much higher frequency/clock rate than would be possible if the signals were to travel off-chip. The proximity of the cores may also allow for the sharing of on-chip memory and resources (e.g., voltage rails), as well as for more coordinated cooperation between cores.

The SoC 100 may include system components and resources 110 for managing sensor data, analog-to-digital conversions, and/or wireless data transmissions, and for performing other specialized operations (e.g., decoding high-definition video, video processing, etc.). System components and resources 110 may also include components such as voltage regulators, oscillators, phase-locked loops (PLLs), peripheral bridges, data controllers, system controllers, access ports, timers, and/or other similar components used to support the processors and software clients running on the computing device. The system components and resources 110 may also include circuitry for interfacing with peripheral devices, such as cameras, electronic displays, wireless communication devices, external memory chips, etc.

The SoC 100 may further include a Universal Serial Bus (USB) controller 112, one or more memory controllers 114, and a centralized resource manager (CRM) 116. The SoC 100 may also include an input/output module (not illustrated) for communicating with resources external to the SoC, each of which may be shared by two or more of the internal SoC components.

The processors 102, 104, 106, 108 may be interconnected to the USB controller 112, the memory controller 114, system components and resources 110, CRM 116, and/or other system components via an interconnection/bus module 122, which may include an array of reconfigurable logic gates and/or implement a bus architecture (e.g., CoreConnect, AMBA, etc.). Communications may also be provided by advanced interconnects, such as high performance networks on chip (NoCs).

The interconnection/bus module 122 may include or provide a bus mastering system configured to grant SoC components (e.g., processors, peripherals, etc.) exclusive control of the bus (e.g., to transfer data in burst mode, block transfer mode, etc.) for a set duration, number of operations, number of bytes, etc. In some cases, the interconnection/bus module 122 may implement an arbitration scheme to prevent multiple master components from attempting to drive the bus simultaneously.

The memory controller 114 may be a specialized hardware module configured to manage the flow of data to and from a memory 124 via a memory interface/bus 126. In certain aspects, the memory 124 may be implemented using a ferroelectric semiconductor device, as described in more detail herein.

The memory controller 114 may comprise one or more processors configured to perform read and write operations with the memory 124. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In certain aspects, the memory 124 may be part of the SoC 100.

EXAMPLE FERROELECTRIC (FE) TRANSISTOR

Certain aspects of the present disclosure are generally directed to a ferroelectric (FE) high-κ (HK) field-effect transistor (FEHKFET) device. Ferroelectricity is a characteristic of certain materials that have a spontaneous electric polarization that may be reversed by the application of an external electric field. The FEHKFET device may be implemented using an FE metal-gate (MG) field-effect transistor (FEMGFET) coupled to a high-κ (HK) metal-gate field-effect transistor (HKMGFET), as described in more detail herein. The FEHKFET device may be implemented in a manner that allows for the gate width of the FEHKFET to be tunable. In other words, the ratio of the size of the gate region and the FE region of the FEHKFET device may be tunable during design. In certain aspects, the FEHKFET may include an FE capacitor, as described in more detail herein. The capacitance of the FE capacitor may be adjusted by setting the gate width of the gate region of the FEHKFET device during design of the FEHKFET. The FEHKFET device may be used to implement a non-volatile memory cell for neuromorphic computations, for example.

Figure 2:
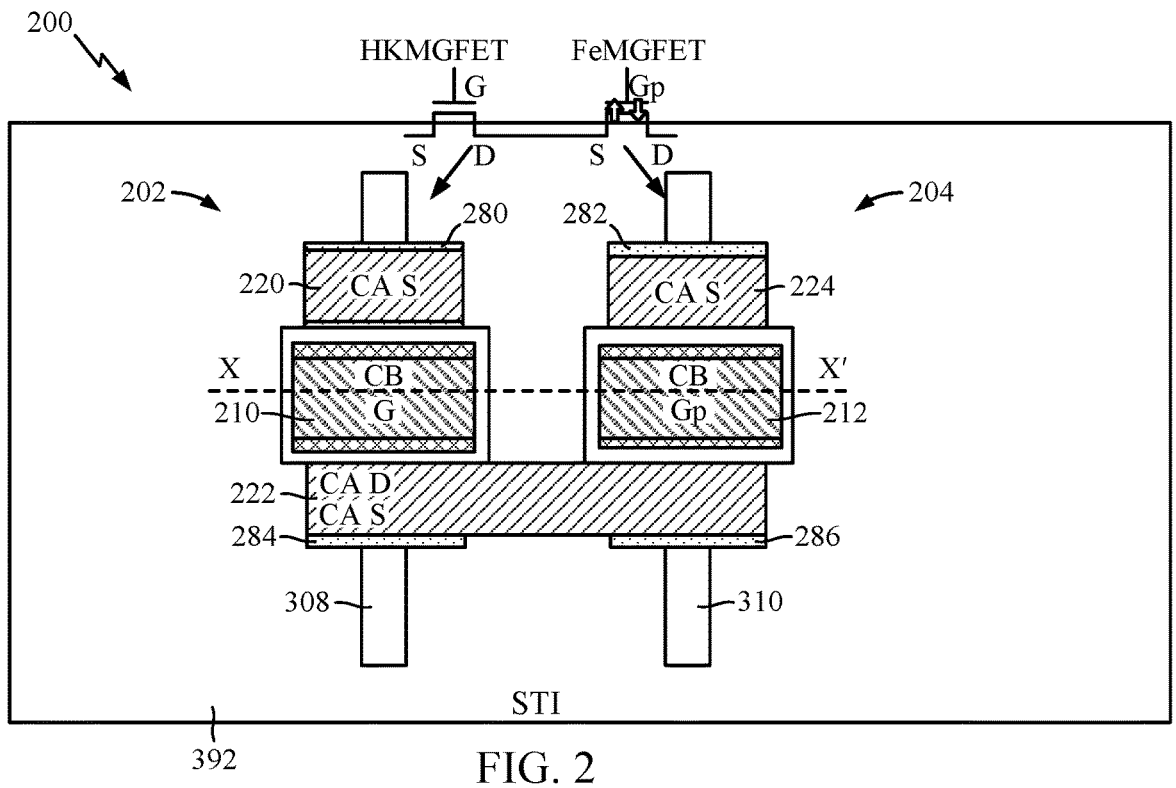
FIGS. 2 and 3 illustrate a top view and a cross-section, respectively, of a first configuration of an example non-volatile memory cell implemented using a ferroelectric transistor, in accordance with certain aspects of the present disclosure.
Figure 3:
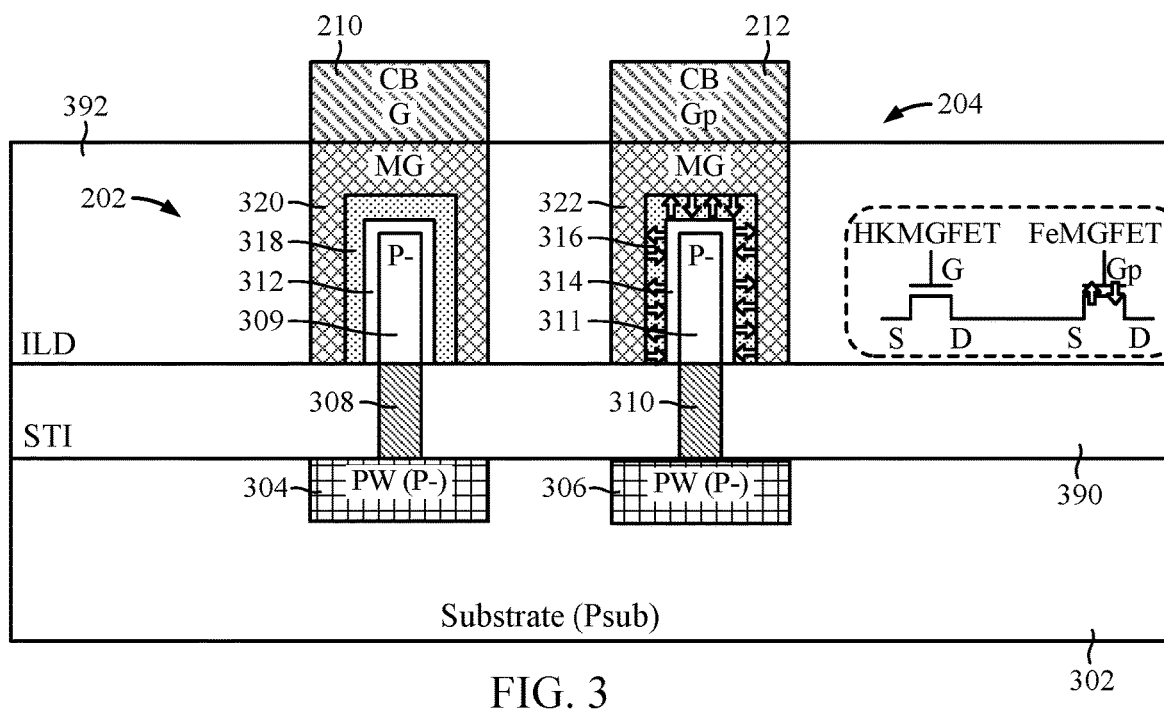

FIGS. 2 and 3 illustrate a top view and a cross-section, respectively, of an example non-volatile memory cell 200 implemented using a FEMGFET 204, in accordance with certain aspects of the present disclosure. FIG. 3 is a cross-section taken through line X-X' in FIG. 2.

The memory cell 200 includes a pass-gate (PG) transistor (also referred as an access transistor) implemented using a HKMGFET 202 coupled to the FEMGFET 204. As illustrated in FIG. 3, the memory cell 200 includes a substrate 302 and well (e.g., p-well (PW)) regions 304, 306 (e.g., P-well regions). A fin (e.g., having fin regions 308, 309) is disposed above the well region 304, and a fin (e.g., having fin regions 310, 311) is disposed above the well region 306.

As illustrated, an interlayer oxide (e.g., gate oxide regions 312, 314) is disposed adjacent to each of the fin regions 309, 311, respectively. The FEMGFET 204 includes an FE region 316 (e.g., ferroelectric hafnium-doped zinc oxide (HfZnO)) adjacent to the fin region 311, and the HKMGFET 202 includes an HK region 318 (e.g., high-κ hafnium oxide ($HfO_2$)) adjacent to the fin region 309. Moreover, metal gate (MG) regions 320, 322 may be disposed adjacent to the HK region 318 and the FE region 316, respectively.

In certain aspects, contacts 210, 212 (e.g., labeled as contact B (CB) in FIGS. 2 and 3) may be disposed above respective MG regions 320, 322. As illustrated in FIG. 2, contact regions 220, 224 (e.g., labeled as contact A (CA) in FIG. 2) are disposed above a source region 280 of the HKMGFET 202 and above a drain region 282 of the FEMGFET 204, respectively. For example, the contact region 220 is the source contact of the HKMGFET 202, and the contact region 224 is the drain contact of the FEMGFET 204. Moreover, a contact region 222 may be formed above a drain region 284 of the HKMGFET 202 and a source region 286 of the FEMGFET 204. Contact region 222 connects (e.g., shorts) and serves as the drain of the HKMGFET 202 and the source of the FEMGFET 204, as illustrated. Shallow trench isolation (STI) region 390 and interlayer dielectric (ILD) 392 may be disposed around portions of the HKMGFET 202 and the FEMGFET 204, as illustrated.

As described herein, the HKMGFET 202 may be a pass transistor (e.g., also referred to as an access transistor) for the FEMGFET 204. The FEMGFET 204 is a storage transistor used to store a bit for the memory cell 200. For instance, the dipole of the FE region 316 may be set depending on whether a logic low or a logic high state is to be stored in the memory cell 200. For instance, memory cell 200 may be programmed (e.g., program a logic high state) by setting the gate and the source of the HKMGFET 202 to 0 V and 0.8 V, respectively, setting the drain of the FEMGFET 204 to 0 V, and setting the gate of the FEMGFET to −1.8 V or higher. The memory cell 200 may be read by setting the gate of the HKMGFET 202 to 0.8 V, setting the source of the HKMGFET 202 to 0 V, setting the drain of the FEMGFET 204 to 0 V, and setting the gate of the FEMGFET to 0.8 V. The memory cell 200 may be erased (e.g., program a logic low state) by setting the gate and the source of the HKMGFET 202 to 0 V, setting the drain of the FEMGFET 204 to 0 V, and setting the gate of the FEMGFET to 1.8 V or higher.

Figure 4:
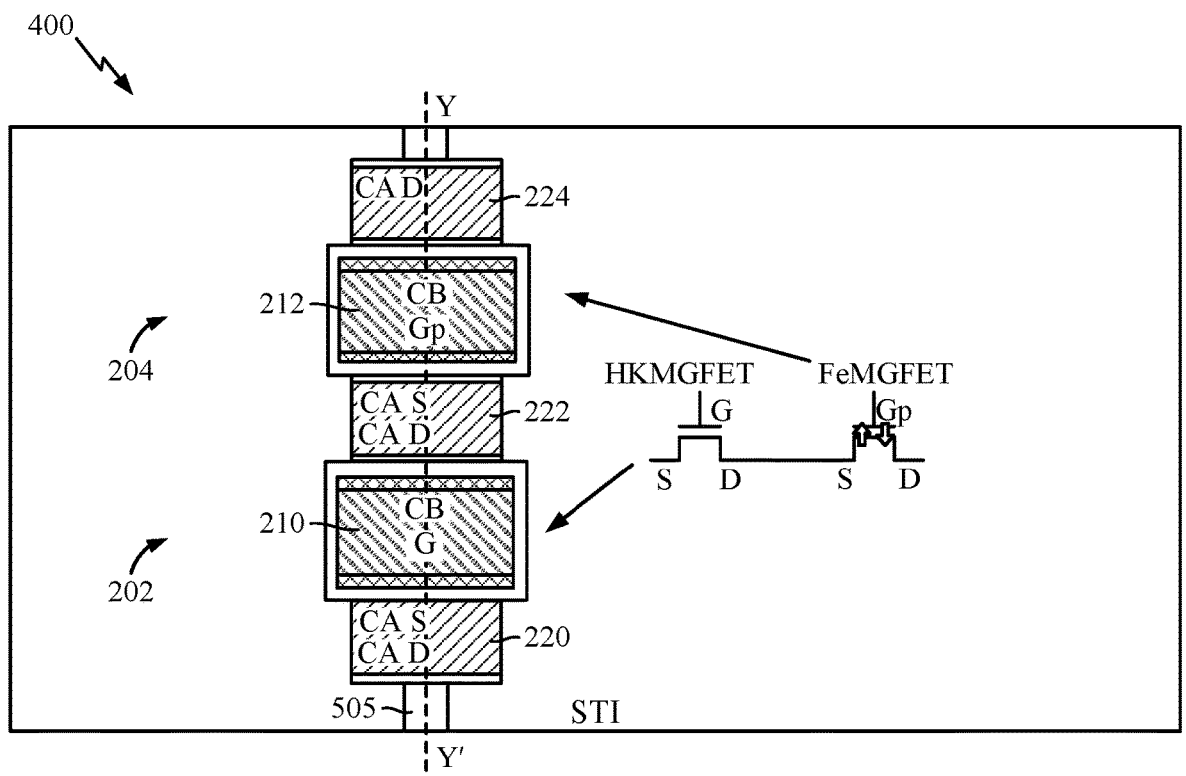
FIGS. 4 and 5 illustrate a top view and a cross-section, respectively, of a second configuration of an example non-volatile memory cell implemented using a ferroelectric transistor, in accordance with certain aspects of the present disclosure.
Figure 5:
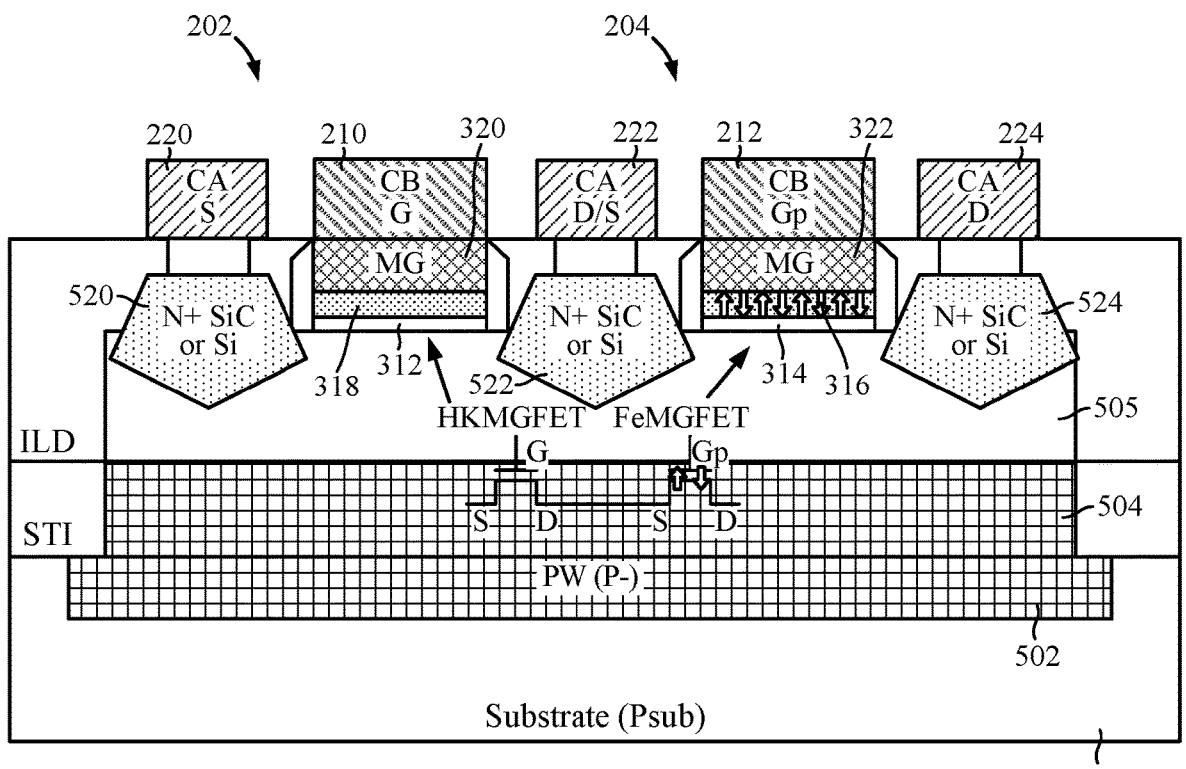

FIGS. 4 and 5 illustrate a top view and a cross-section, respectively, of an example non-volatile memory cell 400 implemented using a FEMGFET 204, in accordance with certain aspects of the present disclosure. FIG. 5 is a cross-section taken through line Y-Y' in FIG. 4. As illustrated, a fin (e.g., having fin regions 504, 505) is disposed above a well (e.g., p-well (PW)) region 502. The gate region (e.g., including MG region 320) of the HKMGFET 202 is between the semiconductor region 520 (e.g., source of HKMGFET 202, corresponding to source region 280) and the semiconductor region 522 (e.g., the drain of the HKMGFET 202 and the source of the FEMGFET 204). In certain aspects, region 520, 522, and/or 524 may comprise N+ silicon carbide (SiC) or silicon (Si). Moreover, the gate region (e.g., including MG region 322) of the FEMGFET 204 is between the semiconductor region 522 and the semiconductor region 524 (e.g., drain of the FEMGFET 204, corresponding to drain region 282). The contact region 222 serves as the drain of the HKMGFET 202 and the source of the FEMGFET 204, as illustrated.

Figure 6:
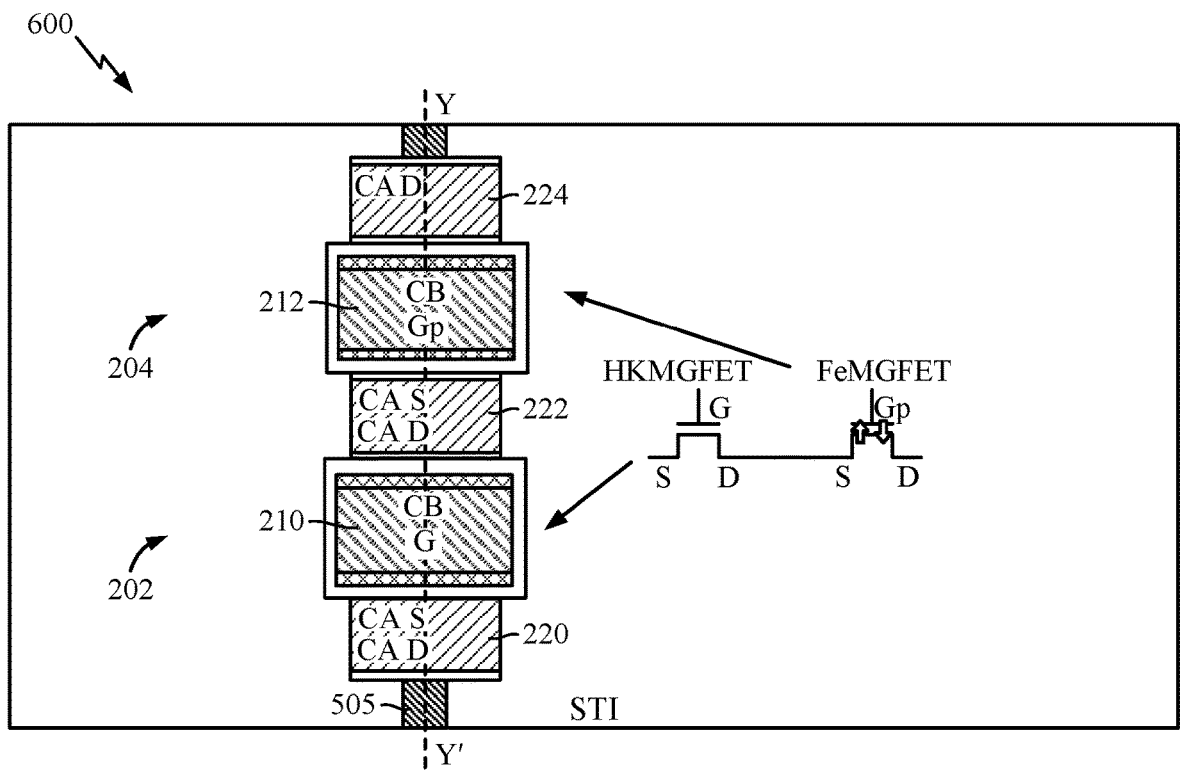
FIGS. 6 and 7 illustrate a top view and a cross-section, respectively, of an example non-volatile memory cell implemented using a ferroelectric transistor having an n-type channel, in accordance with certain aspects of the present disclosure.
Figure 7:
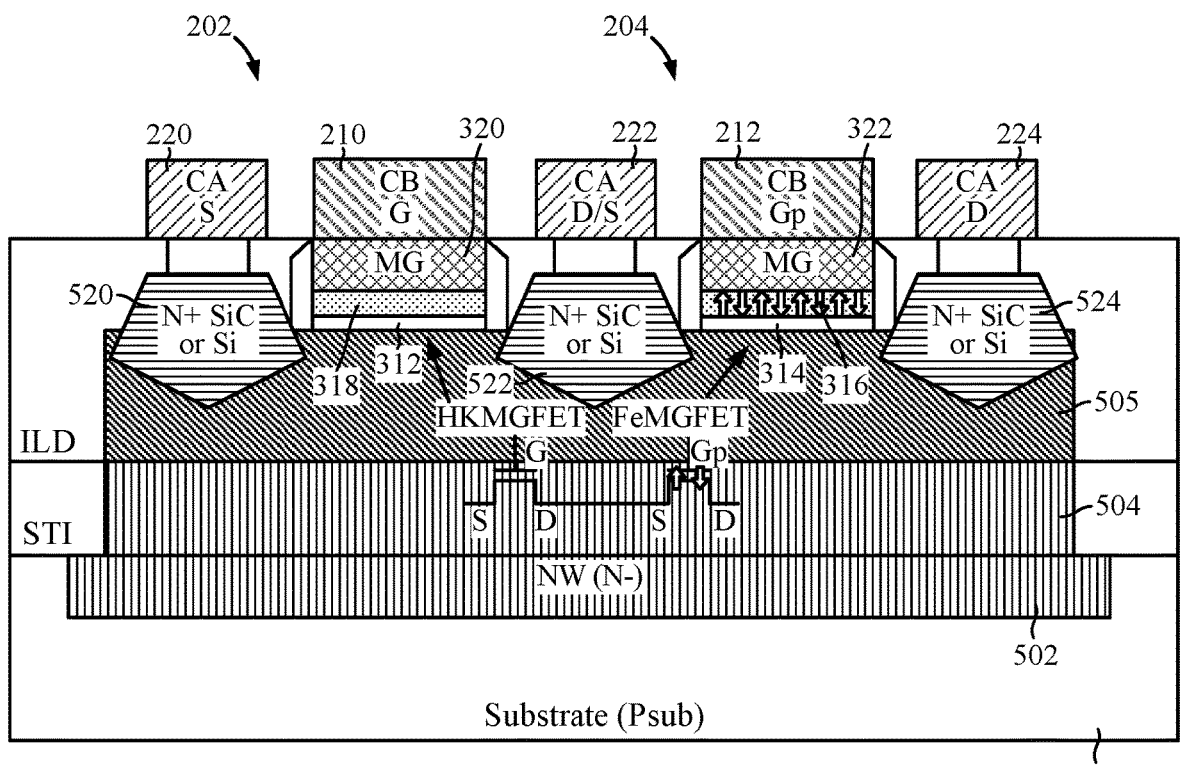

FIGS. 6 and 7 illustrate a top view and a cross-section, respectively, of an example non-volatile memory cell 600 implemented using a FEMGFET 204, in accordance with certain aspects of the present disclosure. FIG. 7 is a cross-section taken through line Y-Y' in FIG. 6. The non-volatile memory cell 600 is illustrated using p-type source and drain regions, as opposed to the memory cell 400 that is implemented using n-type source and drain regions. For instance, the well region 502, and the fin regions 504, 505 may be implemented as n-type regions, and the semiconductor regions 520, 522, 524 may be implemented as p-type (e.g., P+) regions.

Figure 8:
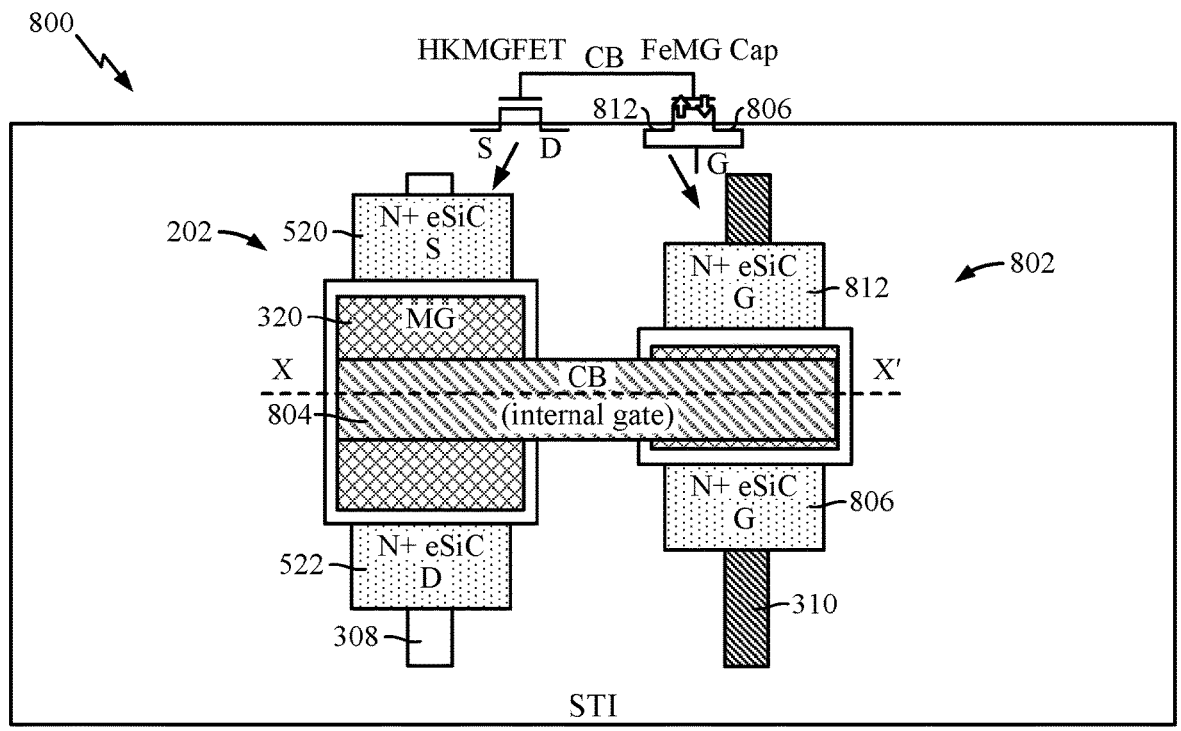
FIGS. 8 and 9 illustrate a top view and a cross-section, respectively, of a first configuration of an example non-volatile memory cell implemented using a ferroelectric capacitor, in accordance with certain aspects of the present disclosure.
Figure 9:
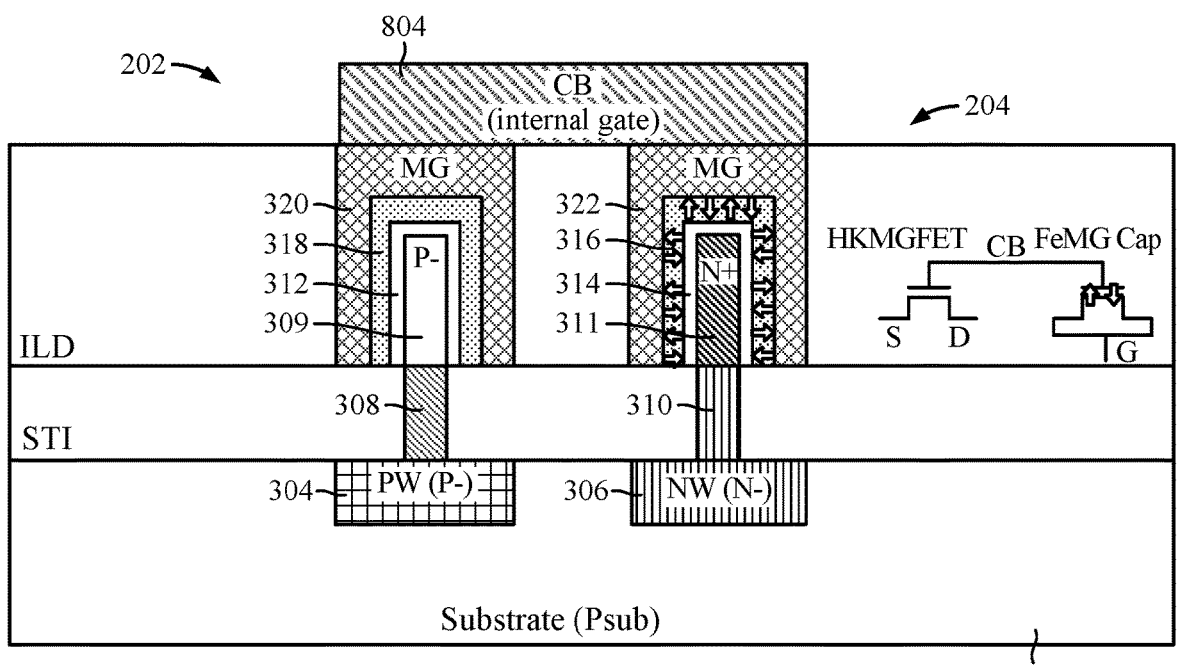

FIGS. 8 and 9 illustrate a top view and a cross-section, respectively, of an example non-volatile memory cell 800 implemented using a FEMG capacitor 802, in accordance with certain aspects of the present disclosure. FIG. 9 is a cross-section taken through line X-X' in FIG. 8. As illustrated in FIG. 9, the gate contact region 804 may be used to connect (e.g., short) the MG regions 320, 322 of the HKMGFET 202 and the FEMG capacitor 802. In certain aspects, the semiconductor regions 806, 812, illustrated in FIG. 8, may be shorted to form a gate for the memory cell 800. As illustrated, the regions 306, 310, 311 are N-doped, whereas in other aspects described herein (e.g., with respect to FIG. 3), the regions 304, 308, 309, 306, 310, and 311 were all P-doped.

Figure 10:
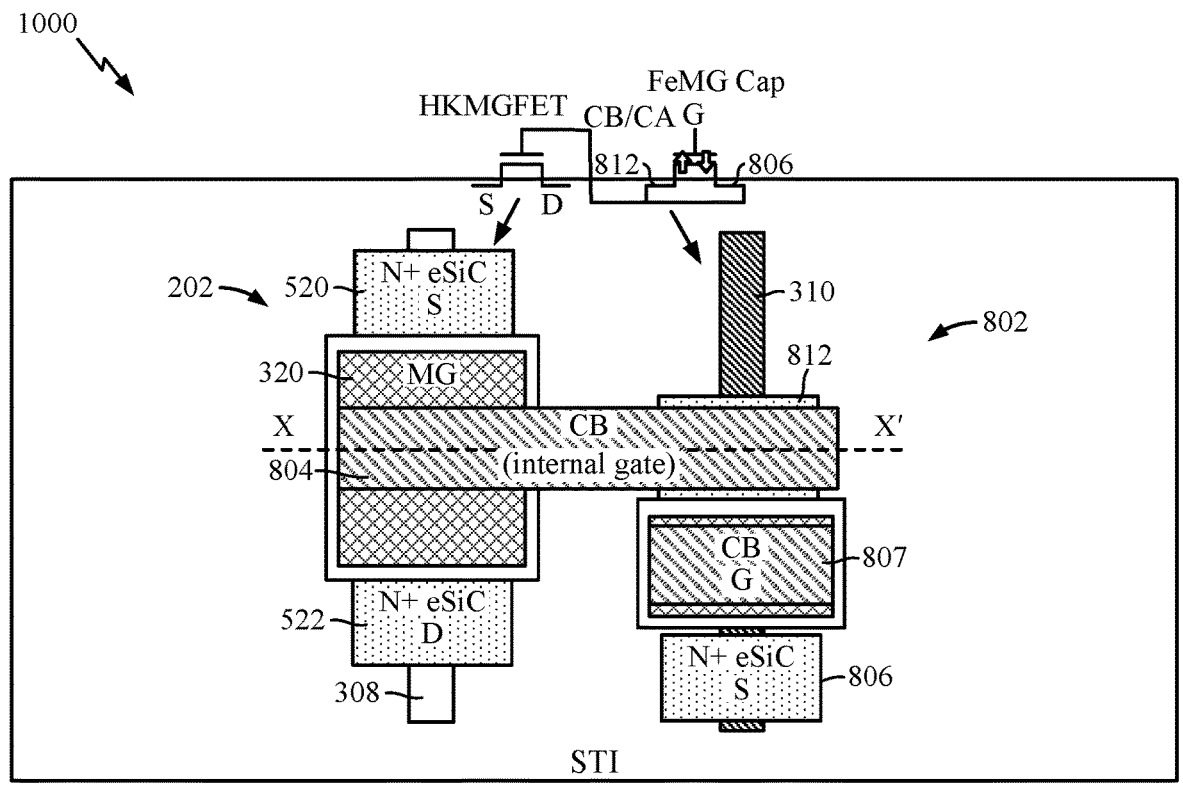
FIGS. 10 and 11 illustrate a top view and a cross-section, respectively, of a second configuration of an example non-volatile memory cell implemented using a ferroelectric capacitor, in accordance with certain aspects of the present disclosure.
Figure 11:
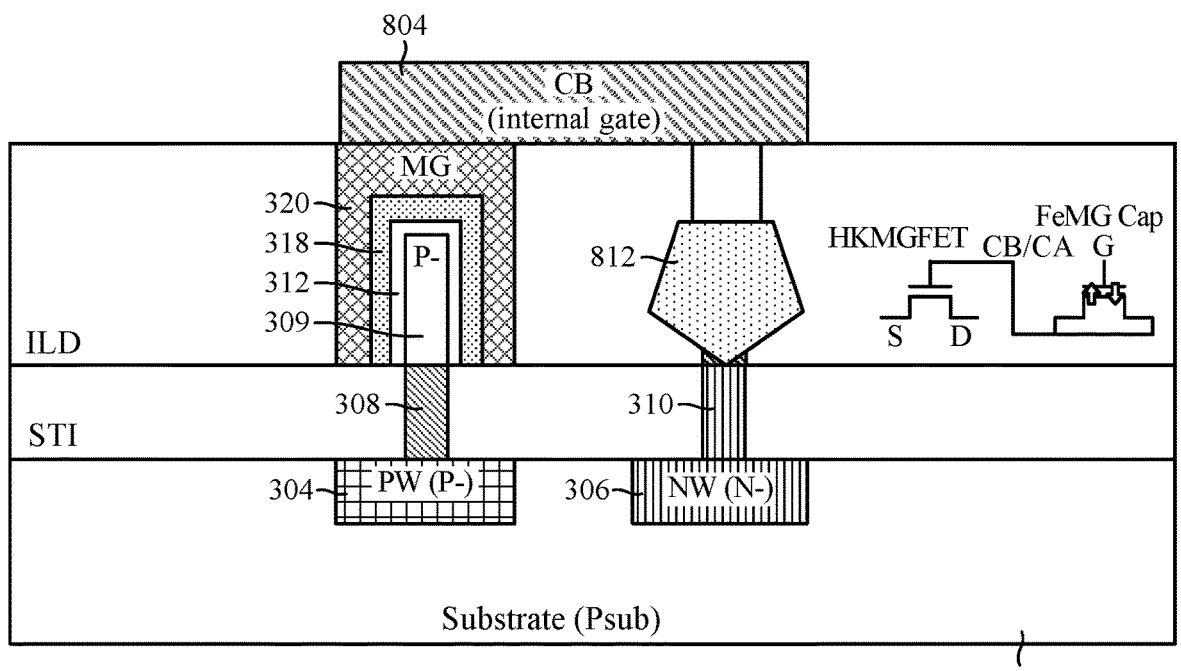

FIGS. 10 and 11 illustrate a top view and a cross-section, respectively, of an example non-volatile memory cell 1000 implemented using a FEMG capacitor 802, in accordance with certain aspects of the present disclosure. FIG. 11 is a cross-section taken through line X-X' in FIG. 10. As illustrated, the gate contact region 804 may be used to short the MG region 320 of the HKMGFET 202 to the semiconductor region 812 of the FEMG capacitor 802. In other words, as compared to the memory cell 800, the FEMG capacitor 802 in memory cell 1000 is implemented such that the center portion of the MG region 320 is aligned with the semiconductor region 812 so that the gate contact region 804 can be disposed to short the MG region 320 and the semiconductor region 812, illustrated. As illustrated, the contact region 807 (e.g., gate of the FEMG capacitor 802) serves as the gate for the memory cell 1000. While not shown in FIG. 10, the ferroelectric portion of the memory cell 1000 is below the contact region 807.

The HKMGFET 202 may be a pass transistor (e.g., also referred to as an access transistor) for the FEMG capacitor 802. The FEMG capacitor 802 is a storage element used to store a bit for the memory cell 800 or 1000. For instance, the dipole of the FE region 316 may be set depending on whether a logic low or a logic high state is to be stored in the memory cell. For instance, memory cell 1000 may be programmed (e.g., program a logic high state) by setting the source and drain of the HKMGFET 202 to 1.8 V or higher, and the gate of the FEMG capacitor 802 to 0 V. The memory cell 1000 may be read by setting the source and drain of the HKMGFET 202 to 0 V and 0.8 V, respectively, and setting the gate of the FEMG capacitor 802 to 0 V. The memory cell 1000 may be erased (e.g., program a logic low state) by setting the source and the drain of the HKMGFET 202 to 0 V and 0.8 V, respectively, and setting the gate of the FEMG capacitor to 1.8 V.

Figure 12A:
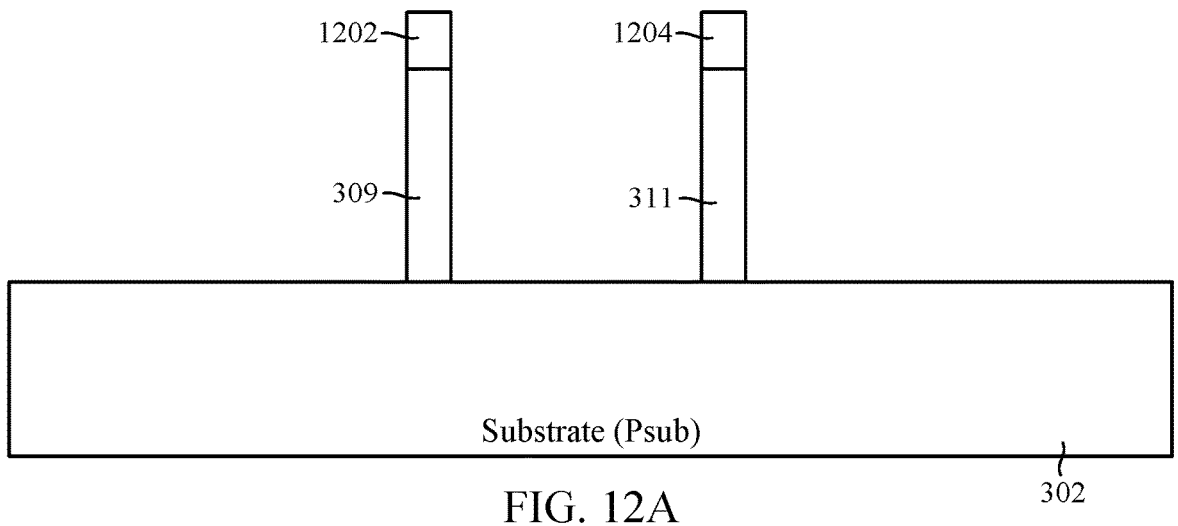
FIGS. 12A-12H illustrate example operations for fabricating the memory cell of FIGS. 8 and 9, in accordance with certain aspects of the present disclosure.
Figure 12B:
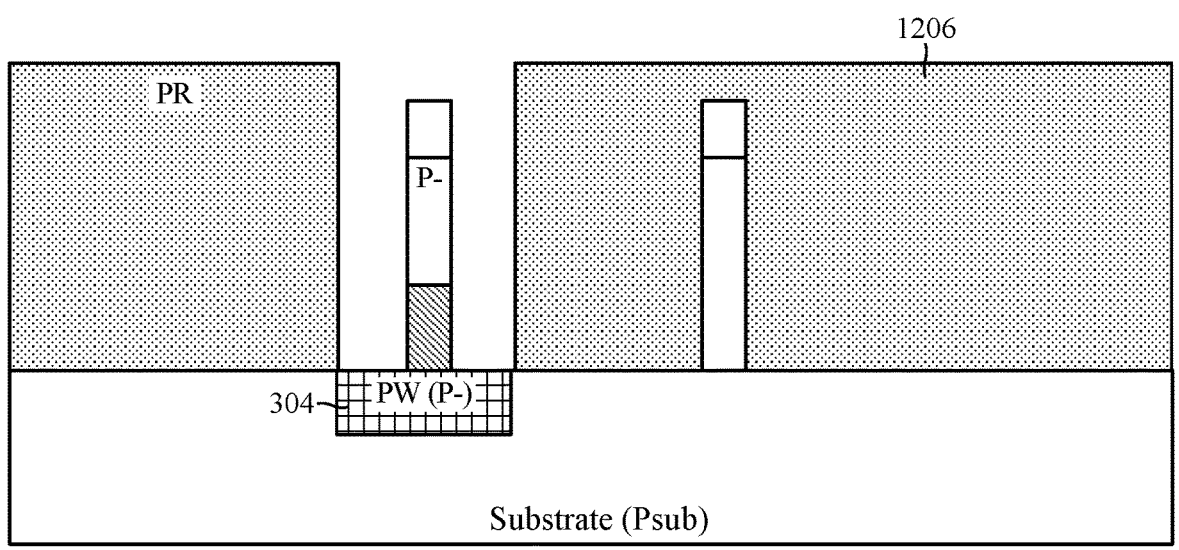
Figure 12C:
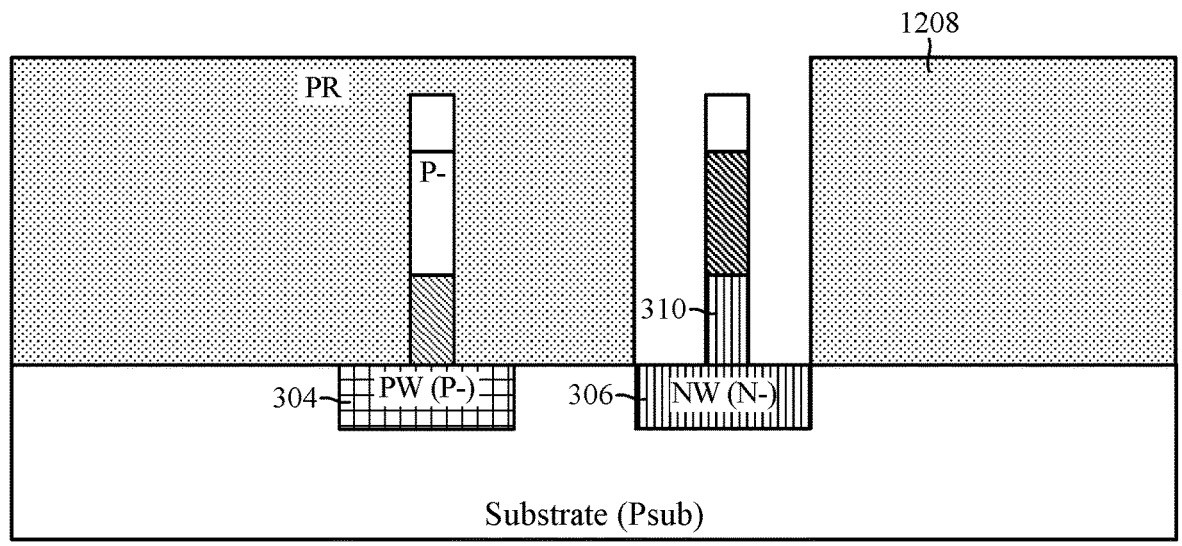
Figure 12D:
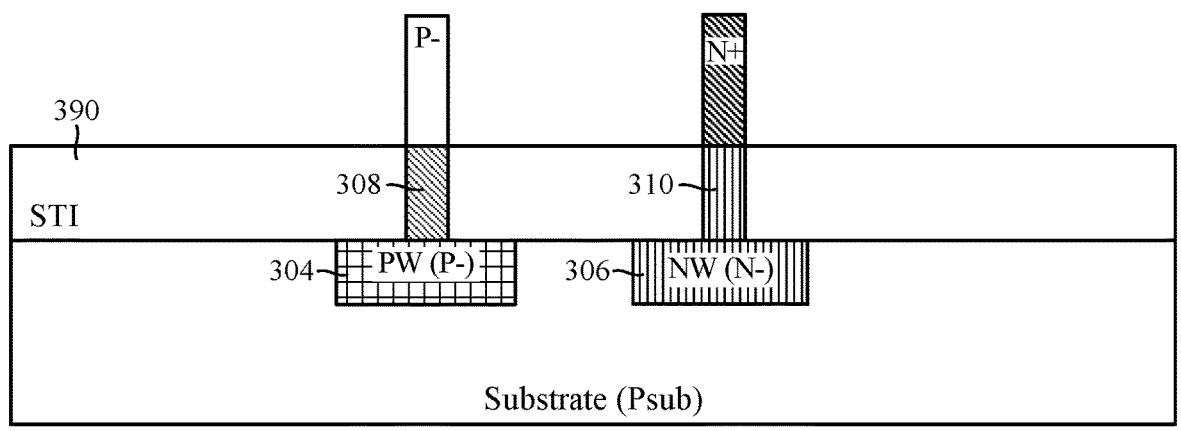
Figure 12E:
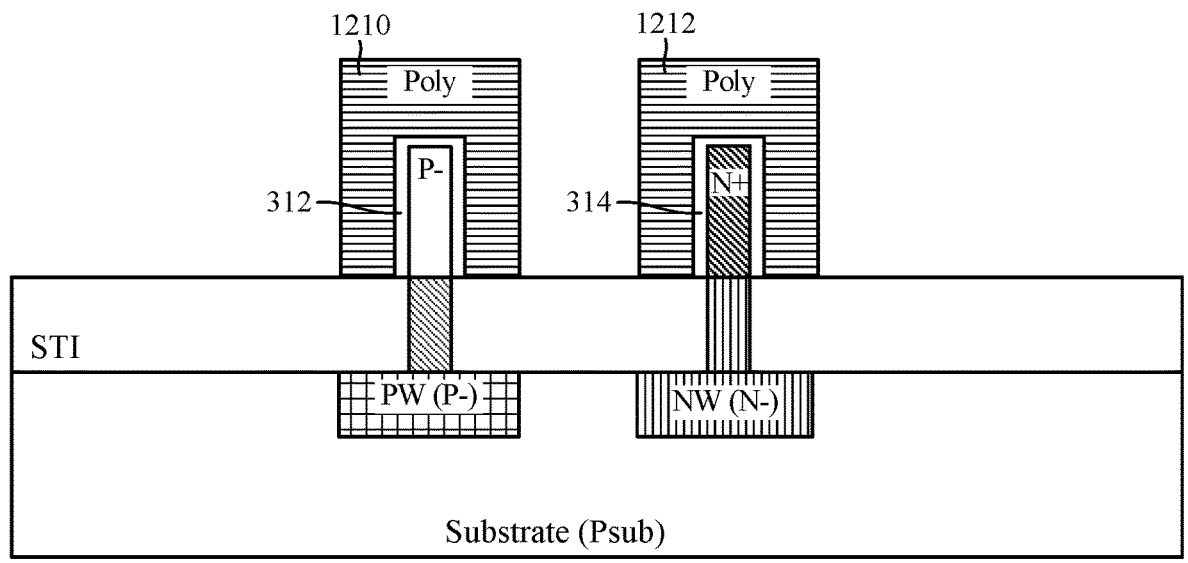
Figure 12F:
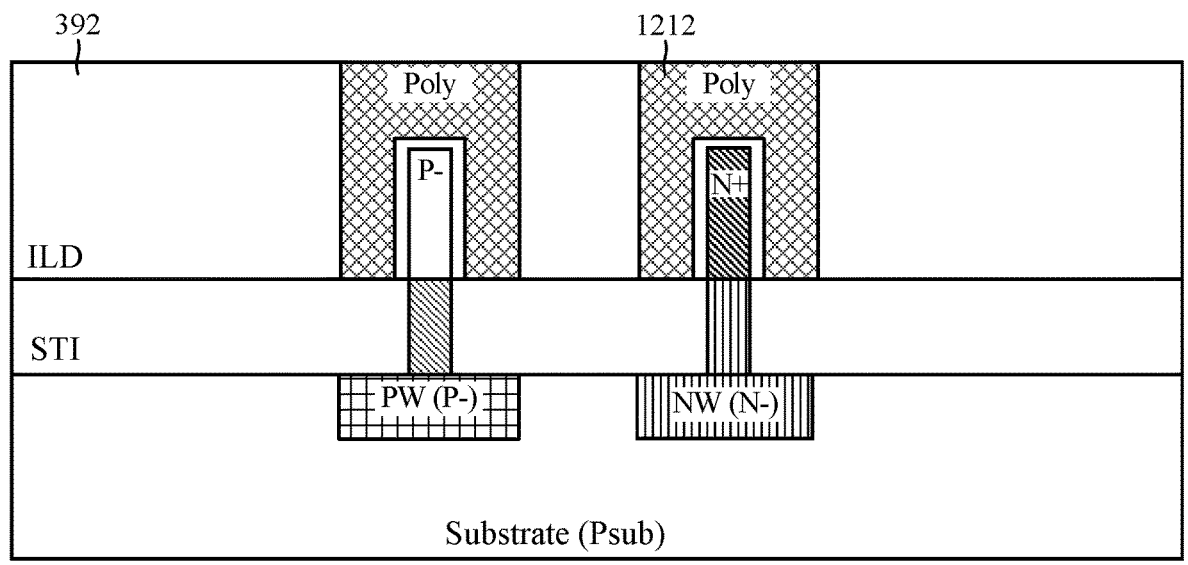
Figure 12G:
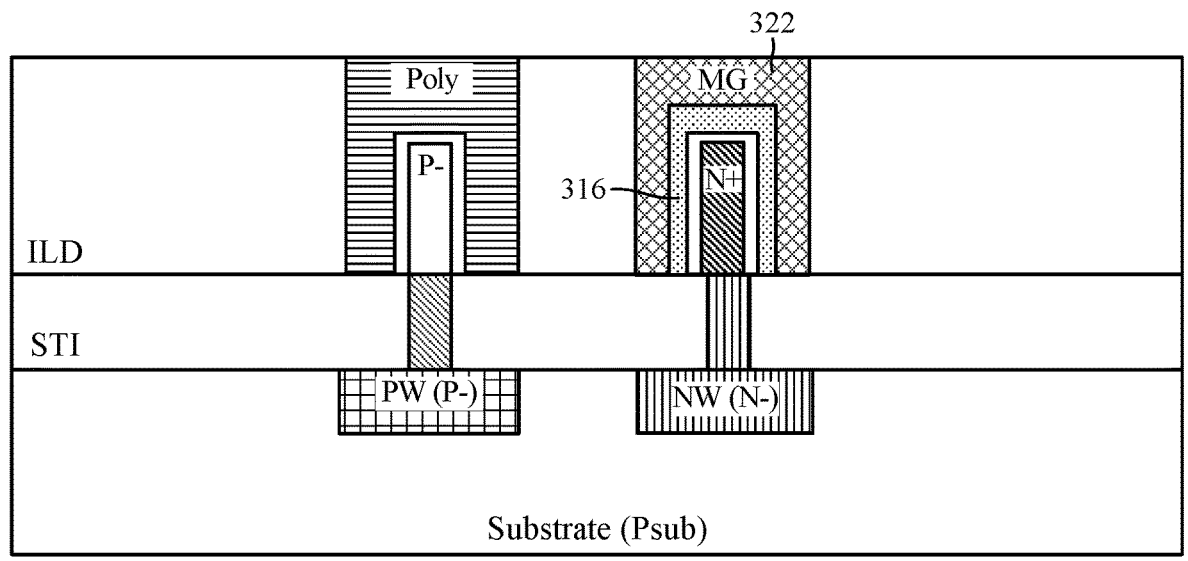

FIGS. 12A-12H illustrate example operations for fabricating the memory cell 800, in accordance with certain aspects of the present disclosure. As illustrated in FIG. 12A, fin regions 309, 311 may be formed above the substrate 302. Moreover, silicon nitride 1202, 1204 (e.g., hard mask) may be formed above respective fin regions 309, 311. As illustrated in FIG. 12B, p-well (PW) photo patterning and P-implant may be performed to form the well region 304. A photoresist (PR) strip operation may then be performed to remove PR 1206. As illustrated in FIG. 12C, n-well (NW) photo patterning and N-implant may be performed to form the well region 306. A PR strip operation may then be performed to remove the PR 1208. As illustrated in FIG. 12D, oxide may be deposited to form the STI region 390, followed by oxide chemical mechanical planarization (CMP), recess of the oxide, and removal of the silicon nitride ($Si_3N_4$) 1202, 1204. As illustrated in FIG. 12E, growth of gate oxide may be performed to form the gate oxide regions 312, 314, followed by deposition of dummy poly and patterning of poly gate to form the poly gate regions 1210, 1212 (e.g., polysilicon (poly) dummy poly). As illustrated in FIG. 12F, ILD 392 may be deposited, followed by CMP of the ILD. As illustrated in FIG. 12G, the poly dummy poly (e.g., poly gate region 1212) may be removed, followed by deposition of IL gate oxide and ferroelectric film (e.g., hafnium silicate ($HfSiO_4$) or hafnium zinc oxide (HfZnO) ferroelectric film) to form the FE region 316. Anneal of the $HfSiO_4$ or HfZnO for the FE region 316 may then be performed, followed by deposition of metal gate film (e.g., titanium nitride (TiN)/tungsten (W)) and CMP of the memory cell to form the MG region 322. The ferroelectric film process and anneal may be performed before HK/MG formation, allowing for a higher anneal temperature as compared to conventional implementations where the ferroelectric film process and anneal process are performed after the HK/MG formation.

Figure 12H:
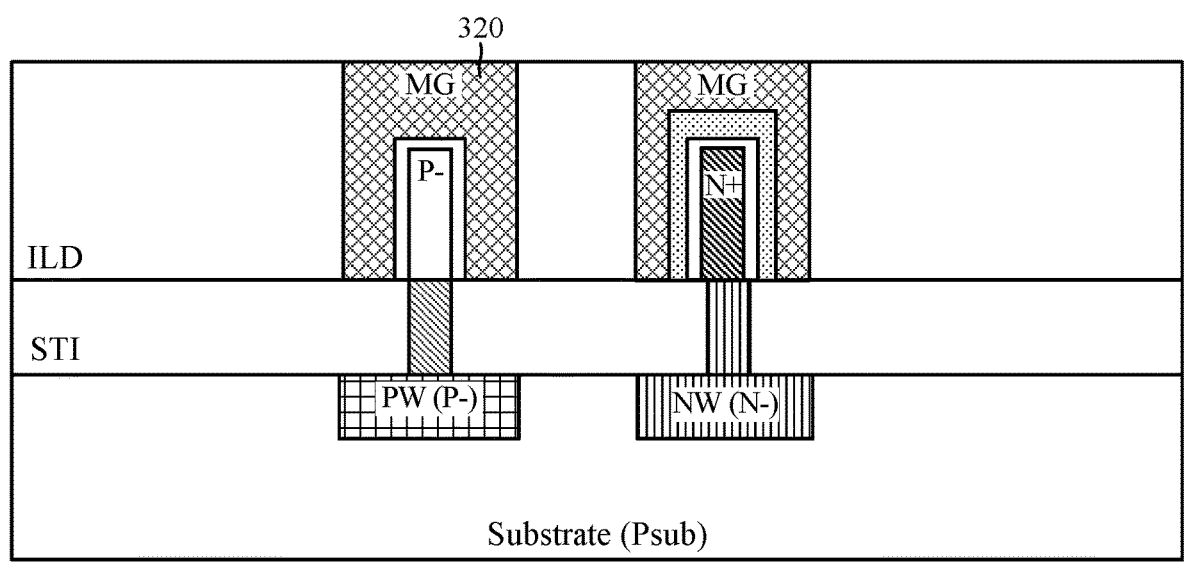

As illustrated in FIG. 12H, the dummy poly from the HKMGFET 202 may be removed, followed by deposition of IL gate oxide and hafnium oxide ($HfO_2$) HK film to form the HK region 318. The metal gate film (e.g., TiN/W) deposition and CMP of the memory cell may be then performed to form the MG region 320. As illustrated in FIG. 9, contact B (CB) film may be deposited, and patterning of the CB film may be performed to connect MG regions 320, 322 of the HKMGFET 202 and FEMGFET 204.

Figure 13:
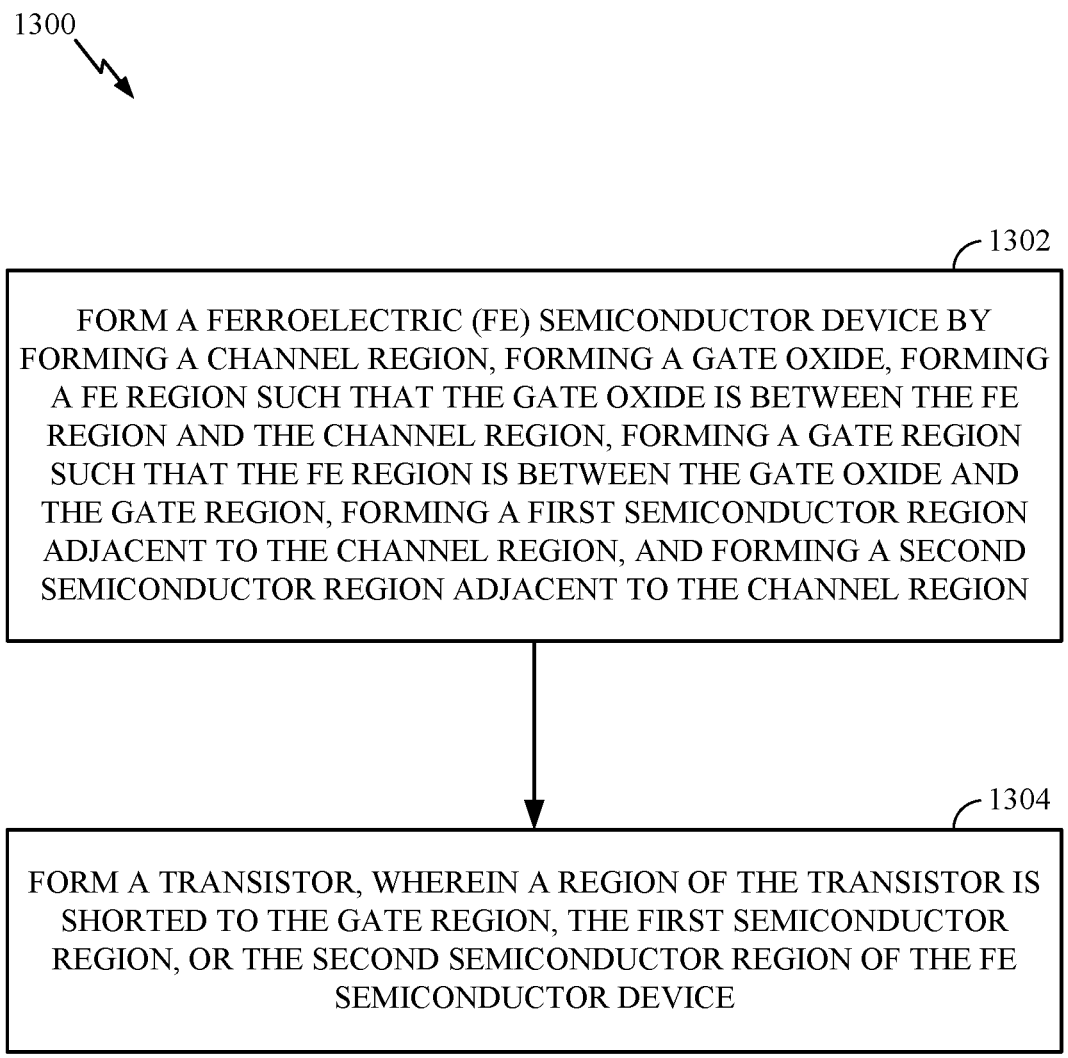
FIG. 13 is a flow diagram illustrating example operations for fabricating a semiconductor device, in accordance with certain aspects of the present disclosure.

FIG. 13 is a flow diagram illustrating example operations 1300 for fabricating a semiconductor device, in accordance with certain aspects of the present disclosure. The operations 1300 may be performed via a semiconductor fabrication chamber.

The operations 1300 begin, at block 1302, with the semiconductor fabrication chamber forming an FE semiconductor device (e.g., FEMGFET 204 or FEMG capacitor 802) by forming a channel region (e.g., fin region 311), forming a gate oxide (e.g., gate oxide region 314), and forming a FE region (e.g., FE region 316) such that the gate oxide is formed between the FE region and the channel region. The FE semiconductor device may also be formed by forming a gate region (e.g., MG region 322) such that the FE region is between the gate oxide and the gate region, forming a source region (e.g., source region 286 or semiconductor region 812) adjacent to the channel region, and forming a drain region (e.g., drain region 282) adjacent to the channel region. In certain aspects, the gate region is formed in accordance with a selected gate width. The operations 1300 may also include, at block 1304, the semiconductor fabrication chamber forming a transistor (e.g., HKMGFET 202), wherein a region of the transistor is connected to the gate region, the first semiconductor region, or the second semiconductor region of the FE semiconductor device.

In certain aspects, forming the transistor may include forming another channel region (e.g., fin region 309), forming another gate oxide (e.g., gate oxide region 312), and forming another gate region (e.g., MG region 320) such that the other gate oxide is between the other channel region and the other gate region. Forming the transistor may also involve forming a third semiconductor region (e.g., source region 280) adjacent to the other channel region, and forming a fourth semiconductor region (e.g., drain region 284) adjacent to the other channel region.

In some cases, the first semiconductor region and the second semiconductor region may be a source region (e.g., source region 286) and a drain region (e.g., drain region 282) of the FE transistor, respectively. Moreover, the third semiconductor region and the fourth semiconductor region may be another source region (e.g., source region 280) and another drain region (e.g., drain region 284) of the transistor, respectively. In certain aspects, the source region of the FE semiconductor device may be connected to the other drain region of the transistor. In some cases, the source region of the FE semiconductor device and the other drain region of the transistor may be the same region.

In certain aspects, the operations 1300 may also include forming a contact region configured to connect the gate region of the FE semiconductor device to the other gate region of the transistor. In certain aspects, the operations 1300 may include forming a contact region configured to connect the other gate region of the transistor to the first semiconductor region or the second semiconductor region of the FE semiconductor device.

Certain aspects of the present disclosure are directed to various implementations of a FE capacitor and HKMGFET in different fins to form an FEHKMGFET, as described herein. In some cases, FEHKMGFET may use a FE capacitor having a negative capacitance effect to enhance the sharp switching behavior of the HKMGFET. The gate area ratio of the FE capacitor and the HKMGFET may be adjusted to enhance the negative capacitance effect. In certain aspects, an FE transistor and an HKMGFET may be formed using different fins, or using the same fin. The FE capacitor or FE transistor may be programed or erased to store a weight for machine learning. In certain aspects, the FE capacitor or the FE transistor may be formed prior to formation of the HKMGFET such that the fabrication process is compatible with an HK/MG process flow.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein. The algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. A semiconductor device, comprising:
    a ferroelectric (FE) semiconductor device having:
        a channel region;
        a gate oxide;
        a FE region, wherein the gate oxide is disposed between the FE region and the channel region;
        a gate region, wherein the FE region is disposed between the gate oxide and the gate region;
        a first semiconductor region disposed adjacent to the channel region; and
        a second semiconductor region disposed adjacent to the channel region; and
    a transistor, wherein a region of the transistor is connected to the gate region, the first semiconductor region, or the second semiconductor region of the FE semiconductor device, the transistor comprising:
        another channel region;
        another gate oxide;
        another gate region, wherein the other gate oxide is disposed between the other channel region and the other gate region;
        a third semiconductor region disposed adjacent to the other channel region;
        a fourth semiconductor region disposed adjacent to the other channel region; and
        a high-κ (HK) region, wherein the gate oxide is disposed between the HK region and the other channel region.

2. The semiconductor device of claim 1, wherein the transistor comprises a non-FE transistor.

3. The semiconductor device of claim 1, wherein: the first semiconductor region and the second semiconductor region comprise a source region and a drain region of the FE semiconductor device, respectively; the third semiconductor region and the fourth semiconductor region comprise another source region and another drain region of the transistor, respectively; and the source region of the FE semiconductor device is connected to the other drain region of the transistor.

4. The semiconductor device of claim 3, wherein the source region of the FE semiconductor device and the other drain region of the transistor comprise the same region.

5. The semiconductor device of claim 4, wherein the channel region of the FE semiconductor device and the other channel region of the transistor are different parts of the same semiconductor region.

6. The semiconductor device of claim 5, wherein the channel region is a fin.

7. The semiconductor device of claim 1, wherein: the first semiconductor region and the second semiconductor region comprise a source region and a drain region of the FE semiconductor device, respectively; the third semiconductor region and the fourth semiconductor region comprise another source region and another drain region of the transistor, respectively; and the semiconductor device further comprises a contact region configured to connect the source region of the FE semiconductor device to the other drain region of the transistor.

8. The semiconductor device of claim 1, further comprising a contact region configured to connect the gate region of the FE semiconductor device to the other gate region of the transistor.

9. The semiconductor device of claim 1, further comprising a contact region configured to connect the other gate region of the transistor to the first semiconductor region or the second semiconductor region of the FE semiconductor device.

10. The semiconductor device of claim 9, wherein the first semiconductor region of the FE semiconductor device is connected to the second semiconductor region of the FE semiconductor device.

11. The semiconductor device of claim 1, wherein the channel region comprises a fin.

12. The semiconductor device of claim 1, wherein the gate region comprises a metal gate (MG) region.

13. The semiconductor device of claim 1, wherein the FE region comprises hafnium zinc oxide or hafnium silicate.

14. The semiconductor device of claim 1, wherein the other gate region of the transistor comprises a metal gate (MG) region.

\* \* \* \* \*